United States Patent
Kim et al.

(10) Patent No.: US 11,566,345 B2
(45) Date of Patent: Jan. 31, 2023

(54) CADMIUM-FREE SEMICONDUCTOR NANOCRYSTAL PARTICLES HAVING HIGH QUANTUM EFFICIENCY, PRODUCTION METHODS THEREOF, AND DEVICES INCLUDING THE SAME

(71) Applicant: SAMSUNG ELECTRONICS CO., LTD., Suwon-si (KR)

(72) Inventors: Jin A Kim, Suwon-si (KR); Yuho Won, Seoul (KR); Sung Woo Kim, Hwaseong-si (KR); Tae Hyung Kim, Seoul (KR); Jeong Hee Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 709 days.

(21) Appl. No.: 16/281,232

(22) Filed: Feb. 21, 2019

(65) Prior Publication Data
US 2019/0257003 A1 Aug. 22, 2019

(30) Foreign Application Priority Data
Feb. 21, 2018 (KR) .................. 10-2018-0020799

(51) Int. Cl.
*B32B 5/16* (2006.01)
*B05D 7/00* (2006.01)
(Continued)

(52) U.S. Cl.
CPC ............... *C30B 29/48* (2013.01); *C01G 9/08* (2013.01); *C09K 11/02* (2013.01); *C09K 11/565* (2013.01);
(Continued)

(58) Field of Classification Search
CPC .................. Y10T 428/2991; B82B 1/008
(Continued)

(56) References Cited

U.S. PATENT DOCUMENTS 9,196,682 B2 11/2015 Jang et al.
9,698,311 B2 7/2017 Greco et al.
(Continued)

FOREIGN PATENT DOCUMENTS

CN 102086396 A 6/2011
CN 1020886396 A 6/2011
(Continued)

OTHER PUBLICATIONS

Gao et al., Bulk-like ZnSe Quantum Dots Enabling Efficient Ultranarrow Blue Light-Emitting Diodes, Nano Letters 2021 21 (17), 7252-7260; DOI: 10.1021/acs.nanolett.1c02284 (Year: 2021).*
(Continued)

*Primary Examiner* — Hoa (Holly) Le
(74) *Attorney, Agent, or Firm* — Cantor Colburn LLP

(57) ABSTRACT

A semiconductor nanocrystal particle, a production method thereof, and a light emitting device including the same. The semiconductor nanocrystal particle includes a core including a first semiconductor nanocrystal, a first shell surrounding the core, the first shell including a second semiconductor nanocrystal including a different composition from the first semiconductor nanocrystal, a second shell surrounding the first shell, the second shell including a third semiconductor nanocrystal including a different composition from the second semiconductor nanocrystal, wherein the first semiconductor nanocrystal includes zinc and sulfur; wherein the third semiconductor nanocrystal includes zinc and sulfur; wherein an energy bandgap of the second semiconductor nanocrystal is less than an energy bandgap of the first semiconductor nanocrystal and less than an energy bandgap
(Continued)

of the third semiconductor nanocrystal; and wherein the semiconductor nanocrystal particle does not include cadmium.

22 Claims, 10 Drawing Sheets
(1 of 10 Drawing Sheet(s) Filed in Color)

(51) Int. Cl.
| | |
|---|---|
| *B82Y 20/00* | (2011.01) |
| *C30B 29/48* | (2006.01) |
| *C01G 9/08* | (2006.01) |
| *H01L 51/50* | (2006.01) |
| *H01L 33/28* | (2010.01) |
| *C09K 11/02* | (2006.01) |
| *C09K 11/56* | (2006.01) |
| *C09K 11/88* | (2006.01) |
| *H01L 33/06* | (2010.01) |
| *B82Y 40/00* | (2011.01) |

(52) U.S. Cl.
CPC ............ *C09K 11/883* (2013.01); *H01L 33/06* (2013.01); *H01L 33/28* (2013.01); *H01L 51/502* (2013.01); *B82Y 20/00* (2013.01); *B82Y 40/00* (2013.01); *C01P 2002/85* (2013.01); *C01P 2004/04* (2013.01); *C01P 2004/64* (2013.01)

(58) Field of Classification Search
USPC ........... 428/403; 977/813, 815; 427/215–217
See application file for complete search history.

(56) References Cited

U.S. PATENT DOCUMENTS

| | | | |
|---|---|---|---|
| 9,773,942 B2 | 9/2017 | Kazama et al. | |
| 10,032,955 B2 | 7/2018 | Kazama et al. | |
| 2005/0129947 A1* | 6/2005 | Peng ..................... | H01L 31/036 428/917 |
| 2008/0220593 A1 | 9/2008 | Pickett et al. | |
| 2010/0163800 A1* | 7/2010 | Peng ..................... | C09K 11/565 977/773 |
| 2010/0308272 A1* | 12/2010 | Peng ..................... | C09K 11/02 252/301.4 R |
| 2011/0108799 A1* | 5/2011 | Pickett ................... | B82Y 30/00 257/14 |
| 2011/0124185 A1* | 5/2011 | Alivisatos ............. | C09K 11/883 438/483 |
| 2011/0315954 A1 | 12/2011 | Jang et al. | |
| 2013/0240788 A1* | 9/2013 | Bawendi ............... | C07F 9/5304 252/301.6 S |
| 2015/0108405 A1* | 4/2015 | Peng ..................... | H01L 31/036 252/301.4 R |
| 2015/0184074 A1* | 7/2015 | Breen .................. | C09K 11/574 252/301.36 |
| 2015/0315721 A1 | 11/2015 | Zhong et al. | |
| 2016/0211409 A1 | 7/2016 | Kazama et al. | |
| 2018/0138434 A1* | 5/2018 | Yoon .................... | H01L 29/6609 |

FOREIGN PATENT DOCUMENTS

| | | |
|---|---|---|
| CN | 104987860 A | 10/2015 |
| CN | 106753326 A | 5/2017 |
| EP | 3050936 A1 | 8/2016 |
| JP | 2011080067 A | 4/2011 |
| JP | 2016135863 A | 7/2016 |
| KR | 20140121351 A | 10/2014 |
| WO | 2004066361 A2 | 8/2004 |

OTHER PUBLICATIONS

Liu et al., ZnCuInS/ZnSe/ZnS Quantum Dot-Based Downconversion Light-Emitting Diodes and Their Thermal Effect, Hindawi Publishing Corporation, Journal of Nanomaterials, vol. 2015, Article ID 298614, 10 pages. (Year: 2015).*
Translation copy of CN102086396 (Year: 2011)*
Extended European Search Report dated Jul. 16, 2019, of the corresponding European Patent Application No. 19158388.9.
Biplab Goswami et al., "A Theoretical Study on the Electronic Structure of ZnSe/ZnS and ZnS/ZnSe Core/Shell Nanoparticles", J. Phys. Chem. C, Jul. 11, 2008, pp. 11630-11636, vol. 112.
Oluwasesan Adegoke et al., "Fluorescence properties of alloyed ZnSeS quantum dots overcoated with ZnTe and ZnTe/ZnS shells", Optical Materials, Feb. 21, 2016, pp. 104-110, vol. 54.
Ruosheng Zeng et al., "Water-soluble, highly emissive, color-tunable, and stable Cu-doped ZnSeS/ZnS core/shell nanocrystals", CrystEngComm, The Royal Society of Chemistry, Feb. 5, 2014, pp. 3414-3423, vol. 16.
T. Yao et al., "Fabrication of ZnS/(ZnSe) ~/ZnS single quantum well structures and photoluminescence properties", Journal of Crystal Growth, May 2, 1991, pp. 823-828, vol. 111, Issues 1-4.
Wenfang Xie et al. , "Photoionizationandthird-ordersusceptibilityofaneutraldonor in ZnS/InP/ZnSe core/shellsphericalquantumdots", Physica B, May 15, 2014, pp. 57-60, vol. 449.
JP Office Action dated Jul. 19, 2022, of the corresponding Japanese Patent Application No. 2019-029208.
Santra, Pralay K. et al., Investigation of the Internal Heterostructure of Highly Luminescent Quantum Dot-Quantum ell Nanocrystals. J. Am. Chem. Soc., Dec. 23, 2008, vol. 131, pp. 470-477
M.Y. Shen et al., "The photoluminescence from ZnSj(ZnSe),/ZnS heterostructures," Materials Science and Engineering, 1996, pp. 189-192, A217/218.
Office Action dated Aug. 30, 2022, of the corresponding Chinese Patent Application No. 201910140377.X.

* cited by examiner

CADMIUM-FREE SEMICONDUCTOR NANOCRYSTAL PARTICLES HAVING HIGH QUANTUM EFFICIENCY, PRODUCTION METHODS THEREOF, AND DEVICES INCLUDING THE SAME

CROSS-REFERENCE TO RELATED APPLICATION

This application claims priority to and the benefit of Korean Patent Application No. 10-2018-0020799 filed in the Korean Intellectual Property Office on Feb. 21, 2018, and all the benefits accruing therefrom under 35 U.S.C. § 119, the entire content of which is incorporated herein by reference.

BACKGROUND

1. Field

A semiconductor nanocrystal particle, a production method thereof, and a device including the same are disclosed.

2. Description of the Related Art

Unlike bulk materials, in the case of the nano-particles, some physical characteristics (e.g., energy bandgaps and melting points), which are intrinsic for the bulk materials, may be controlled by changing a particle size thereof. For example, a semiconductor nanocrystal particle also known as a quantum dot is a nano-sized crystalline material. Such a semiconductor nanocrystal particle has a relatively small size, has a large surface area per unit volume, and exhibits a quantum confinement effect, showing properties different from those of a bulk material having the same composition. The quantum dot may absorb light from an excitation source to be excited, and may emit energy corresponding to an energy bandgap of the quantum dot.

In order to improve photoluminescence properties of quantum dots, a core-shell structure may be used, but the core-shell quantum dots having improved properties may be cadmium-based materials. Accordingly, there remains a need for development of cadmium-free semiconductor nanocrystal particles having desirable photoluminescence properties.

SUMMARY

An embodiment provides a cadmium-free semiconductor nanocrystal particle capable of emitting light of a desired wavelength with improved efficiency and a reduced full width at half maximum.

An embodiment provides a method of producing the aforementioned cadmium free quantum dot.

An embodiment provides an electronic device including the aforementioned quantum dot.

In an embodiment, a semiconductor nanocrystal particle includes a core including a first semiconductor nanocrystal, a first shell disposed on (e.g., surrounding) the core, the first shell including a second semiconductor nanocrystal including a different composition from the first semiconductor nanocrystal, and a second shell disposed on (e.g., surrounding) the first shell, the second shell including a third semiconductor nanocrystal including a different composition from the second semiconductor nanocrystal, wherein the first semiconductor nanocrystal includes zinc and sulfur;
wherein the third semiconductor nanocrystal includes zinc and sulfur;
wherein an energy bandgap of the second semiconductor nanocrystal is less than an energy bandgap of the first semiconductor nanocrystal and less than an energy bandgap of the third semiconductor nanocrystal; and
wherein the semiconductor nanocrystal particle does not include cadmium.

The energy bandgap of the first semiconductor nanocrystal may be less than or equal to the energy bandgap of the third semiconductor nanocrystal.

The core, the first shell, and the second shell may include a Group II-VI compound. The core, the first shell, and the second shell may not include a Group III-V compound.

The first shell (or the second semiconductor nanocrystal) may include zinc, selenium, and optionally tellurium.

The first semiconductor nanocrystal may include ZnS, ZnSeS, or a combination thereof.

The first semiconductor nanocrystal (or the core or the quantum dot) may not include copper, manganese, or a combination thereof.

The second semiconductor nanocrystal may include ZnSe, ZnSeTe, ZnSeS, or a combination thereof.

The first shell may include a plurality of layers and in the plurality of layers, adjacent layers include semiconductor nanocrystals of different compositions.

The first shell includes a first layer and a second layer, and an energy bandgap of a semiconductor nanocrystal in the first layer may be less than an energy bandgap of a semiconductor nanocrystal in the second layer.

The first layer may include ZnSeTe.
The second layer may include ZnSe.
The third semiconductor nanocrystal may include ZnS.

A maximum photoluminescent peak of the semiconductor nanocrystal particle may be in a range between about 400 nanometers (nm) and about 500 nm.

A maximum photoluminescent peak of the semiconductor nanocrystal particle may be in a range between about 440 nm and about 470 nm.

A maximum photoluminescent peak of the semiconductor nanocrystal particle may have a full width at half maximum of less than or equal to about 40 nm.

A maximum photoluminescent peak of the semiconductor nanocrystal particle may have a full width at half maximum of less than or equal to about 30 nm.

A quantum efficiency of the semiconductor nanocrystal particle may be greater than or equal to about 40%.

An embodiment provides a quantum dot population including a plurality of semiconductor nanocrystal particles, wherein the plurality of semiconductor nanocrystal particles include the aforementioned semiconductor nanocrystal particle and an average size of the plurality of semiconductor nanocrystal particles may be greater than or equal to about 5 nm and less than or equal to about 50 nm.

A standard deviation of the sizes of the plurality of semiconductor nanocrystal particles may be less than or equal to about 10%. The standard deviation may be denoted as a percentage with respect to the average size.

In an embodiment, a method of producing the aforementioned semiconductor nanocrystal particle includes:
providing a core particle including a core, the core including a first semiconductor nanocrystal;
conducting a reaction between a second metal precursor and a second non-metal precursor of a second semiconductor nanocrystal in the presence of the core particle, an organic solvent, and an organic ligand to obtain a reaction solution including a particle including a first shell including the second semiconductor nanocrystal on the core particle;

adding a third metal precursor and a third non-metal precursor of a third semiconductor nanocrystal to the reaction solution to conduct a reaction therebetween to obtain a semiconductor nanocrystal particle including a second shell including the third semiconductor nanocrystal formed on the first shell.

The forming the first shell may include heating a mixture of the organic solvent, the organic ligand, and the second metal precursor to a first reaction temperature and adding the core particle and the second non-metal precursor to the mixture heated to the first reaction temperature.

The method may further include adding a fluorine containing ionic liquid at the formation of at least one of the first shell and the second shell.

An embodiment provides a light emitting device includes a first electrode and a second electrode facing each other, and a light emitting layer disposed between the first electrode and the second electrode, the light emitting layer including a quantum dot (e.g., a plurality of quantum dots), wherein the quantum dot includes the aforementioned semiconductor nanocrystal particle(s).

The light emitting device may further include a hole auxiliary layer including a hole injection layer (HIL), a hole transport layer (HTL), an electron blocking layer (EBL), or a combination thereof between the first electrode and the light emitting layer.

The light emitting device may further include an electron auxiliary layer including an electron injection layer (EIL), an electron transport layer (ETL), a hole blocking layer, or a combination thereof between the second electrode and the light emitting layer.

An embodiment provides a display device including the light emitting device (e.g., an electroluminescent device).

An embodiment provides a cadmium-free semiconductor nanocrystal particle capable of emitting light of a desired wavelength (e.g., blue light) with improved efficiency and a reduced full width at half maximum (FWHM). The semiconductor nanocrystal particle of an embodiment may exhibit improved stability when exposed to ambient atmosphere. The prepared semiconductor nanocrystal particle may be applied to, e.g., used in, various display devices, biolabeling (e.g., a biosensor or bioimaging), a photodetector, a solar cell, a hybrid composite, and the like.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other advantages and features of this disclosure will become more apparent by describing in further detail exemplary embodiments thereof with reference to the accompanying drawings.

DETAILED DESCRIPTION

Figure 1:
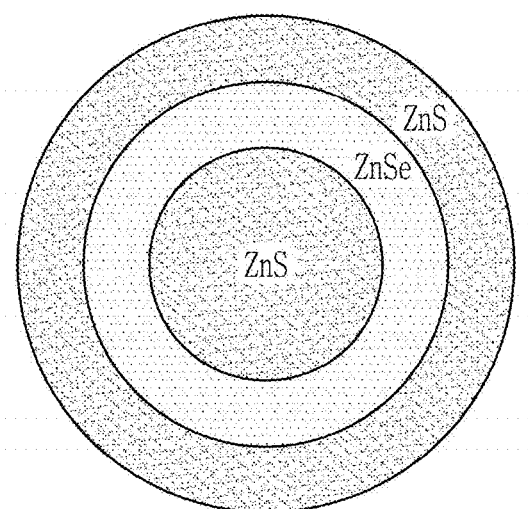
FIG. 1 is a schematic cross-sectional view and a schematic energy band structure of a semiconductor nanocrystal particle of an embodiment.
Figure 1:
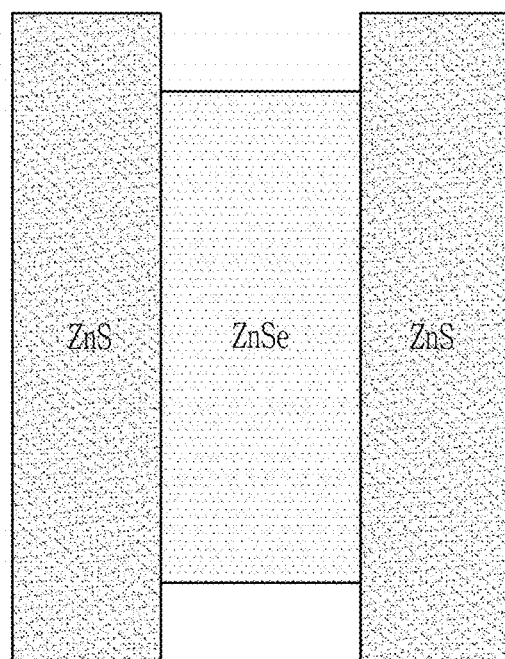

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of the hydrogen atoms thereof is replaced by a substituent provided that the substituted atom's normal valence is not exceeded, selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, a "hydrocarbon group" refers to a group including carbon and hydrogen (e.g., an alkyl, alkenyl, alkynyl, or aryl group). The hydrocarbon group may be a group having a monovalency or greater, for example a monovalent, divalent, or tetravalent group, formed by removal of one or more hydrogen atoms from, for example, an aliphatic or aromatic hydrocarbon group such as alkane, alkene, alkyne, or arene.

In the hydrocarbon group, at least one methylene moiety (—CH$_2$—) may be replaced by an oxide moiety (—O—), a carbonyl moiety (—C(=O)—)), an ester moiety (—C(=O)—O—), an amino moiety —NH—, or a combination thereof. Alternatively, the hydrocarbon group may consist of carbon and hydrogen.

Herein, "aliphatic" refers to a saturated or unsaturated linear or branched hydrocarbon group. An aliphatic group may be an alkyl, alkenyl, or alkynyl group, for example.

Herein, "alkyl" refers to a linear or branched saturated monovalent hydrocarbon group (methyl, ethyl, hexyl, or the like).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aromatic" refers to an organic compound or group comprising at least one unsaturated cyclic group having delocalized pi electrons. The term encompasses both hydrocarbon aromatic compounds and heteroaromatic compounds.

Herein, "aryl" refers to an aromatic hydrocarbon group and means a cyclic moiety including carbon atoms in which at least one ring is aromatic, the moiety having the specified number of carbon atoms, specifically 6 to 40 carbon atoms, more specifically 6 to 24 carbon atoms.

Herein, "hetero" refers to one including 1 to 3 heteroatoms that may be N, O, S, Si, P, or a combination thereof.

Herein, "Group" refers to a group of Periodic Table.

Herein, the term "quantum efficiency" is interchangeable with the term "quantum yield."

The quantum efficiency may be measured by using a commercially available fluorescence spectrometer (e.g., manufactured by Hitachi Co. Ltd., or Otsuka Co., Ltd.) in any appropriate manner, (e.g., a direct method or a relative method).

A semiconductor nanocrystal particle (hereinafter, also referred to as a quantum dot) may absorb light from an excitation source and may emit energy corresponding to the energy bandgap of the semiconductor nanocrystal particle. Energy bandgaps of quantum dots may be varied with particle size and composition of the nanocrystal. For example, as the particle size of the semiconductor nanocrystal particle increases, the energy bandgap of the semiconductor nanocrystal particle may become narrower and a length of the light emitting wavelength of the semiconductor nanocrystal particle may increase. Semiconductor nanocrystals may be used as a light emitting material in various fields of a display device, an energy device, or a bio light emitting device.

Quantum dots having a photoluminescence (PL) property at an applicable level may be based on, e.g., include, cadmium (Cd). Cadmium causes environment/health problems and is one of the restricted elements via Restriction of Hazardous Substances Directive (RoHS) in many countries. Accordingly, there exists a need for development of a cadmium-free semiconductor nanocrystal particle having improved photoluminescence characteristics. In order to be applied to, e.g., used in, a quantum dot light emitting diode (QLED) display device, a semiconductor nanocrystal particle having a relatively narrow full width at half maximum (FWHM) and capable of emitting light of a desired wavelength (e.g., pure blue having a photoluminescence (PL) peak wavelength around 430-455 nm) may be desired. For example, a blue light emitting material having a narrow full width at half maximum (FWHM) may be desired in order to be applied to, e.g., used in, a display device having a relatively high (e.g., about 90% or greater) color reproducibility based on the next generation color standard BT2020. However, a cadmium-free semiconductor nanocrystal particle having photoluminescence properties at an applicable level and the aforementioned PL peak wavelength is not easy to prepare and has not been reported yet.

In an embodiment, a semiconductor nanocrystal particle has a core-shell structure wherein a core including a first semiconductor nanocrystal, a first shell disposed on (e.g., surrounding) the core and including a second semiconductor nanocrystal that has a different composition from the first semiconductor nanocrystal, a second shell disposed on (e.g., surrounding) the first shell and including a third semiconductor nanocrystal that has a different composition from the second semiconductor nanocrystal. The first semiconductor nanocrystal includes zinc and sulfur; the third semiconductor nanocrystal includes zinc and sulfur; an energy bandgap (hereinafter, also referred to as bandgap) of the second semiconductor nanocrystal is less than an energy bandgap of the first semiconductor nanocrystal and an energy bandgap of the third semiconductor nanocrystal. The bandgap of the first semiconductor nanocrystal may be less than or equal to the bandgap of the third semiconductor nanocrystal. In an embodiment, a bulk energy bandgap of a given semiconductor material may represent that of a semiconductor nanocrystal including the given semiconductor material. A bulk energy bandgap of a given semiconductor material may be known in the art. For example, a bulk energy bandgap of ZnS may be greater than those of ZnSe and ZnSeTe. A bulk energy bandgap of ZnSe may be greater than that of ZnSeTe. A bulk energy bandgap of ZnSeS may be greater than that of ZnSe.

The semiconductor nanocrystal particle does not include cadmium. The core, the first shell, and the second shell may include a Group II-VI compound. In an embodiment, the first shell (or the second semiconductor nanocrystal) may include zinc, selenium, and optionally tellurium.

The first semiconductor nanocrystal included in the core may include ZnSe, ZnSeS, or a combination thereof.

A size (e.g., a diameter) of the core may be greater than or equal to about 2 nm, greater than or equal to about 3 nm, or greater than or equal to about 3.5 nm. The size of the core may be less than or equal to about 5 nm, or less than or equal to about 4 nm. The first semiconductor nanocrystal may not include copper, manganese, or a combination thereof. The composition of the core or the semiconductor nanocrystal particle may be confirmed by any appropriate means. For example, the composition of the semiconductor nanocrystal may be confirmed by a mapping analysis and/or an image strength measurement of Energy Dispersive X-ray Spectroscopy (EDS).

On the core, a first shell is disposed and/or surrounds the core. The first shell includes a second semiconductor nanocrystal having a composition different from the composition of the first semiconductor nanocrystal. The energy bandgap of the second semiconductor nanocrystal is less than the energy bandgap of the first semiconductor nanocrystal and the energy bandgap of the third semiconductor nanocrystal that will be recited below.

The first shell (or the second semiconductor nanocrystal) may include zinc, selenium, and optionally tellurium. The second semiconductor nanocrystal may include ZnSe, ZnSeTe, or a combination thereof. The first shell may include a plurality of layers. In the plurality of layers, adjacent layers may include semiconductor nanocrystals of different compositions. For example, the first shell may include a first layer and a second layer and an energy bandgap of a semiconductor nanocrystal included in the first layer may be less than that of a semiconductor nanocrystal included in the second layer. The first layer may include ZnSeTe. The second layer may include ZnSe.

The first shell may include tellurium and may have a concentration gradient wherein a concentration of the tellurium varies in a radial direction (e.g., may increase or decrease toward the core).

In an embodiment, the first shell includes the tellurium and in the semiconductor nanocrystal particle, an amount of the tellurium may be, with respect to 1 mole of the selenium, greater than or equal to about 0.001 moles, for example, greater than or equal to about 0.002 moles, greater than or equal to about 0.003 moles, or greater than or equal to about 0.004 moles.

In the semiconductor nanocrystal particle, an amount of the tellurium may be, with respect to 1 mole of the selenium, less than or equal to about 0.1 moles, less than or equal to about 0.09 moles, less than or equal to about 0.08 moles, less than or equal to about 0.07 moles, less than or equal to about 0.06 moles, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 moles, less than or equal to about 0.039 moles, less than or equal to about 0.035 moles, less than or equal to about 0.03 moles, less than or equal to about 0.029 moles, less than or equal to about 0.025 moles, less than or equal to about 0.024 moles, less than or equal to about 0.023 moles, less than or equal to about 0.022 moles, less than or equal to about 0.021 moles, less than or equal to about 0.02 moles, less than or equal to about 0.019 moles, less than or equal to about 0.018 moles, less than or equal to about 0.017 moles, less than or equal to about 0.016 moles, less than or equal to about 0.015 moles, less than or equal to about 0.014 moles, less than or equal to about 0.013 moles, less than or equal to about 0.012 moles, less than or equal to about 0.011 moles, less than or equal to about 0.01 moles, or less than or equal to about 0.009 moles.

In an embodiment, the first shell includes the tellurium and in the semiconductor nanocrystal particle, an amount of the tellurium may be, with respect to 1 mole of the zinc, greater than or equal to about 0.001 moles, for example, greater than or equal to about 0.002 moles and less than or equal to about 0.02 moles, for example, less than or equal to about 0.015 moles, less than or equal to about 0.01 moles, less than or equal to about 0.009 moles, or less than or equal to about 0.008 moles.

In the semiconductor nanocrystal particle of an embodiment, a mole ratio of the selenium with respect to the zinc (Se/Zn) may be greater than or equal to about 0.1:1, for example, greater than or equal to about 0.2:1, greater than or equal to about 0.25:1, or greater than or equal to about 0.3:1, and less than or equal to about 1:1, for example, less than or equal to about 0.9:1, less than or equal to about 0.8:1, less than or equal to about 0.7:1, or less than or equal to about 0.6:1.

In the semiconductor nanocrystal particle of an embodiment, a mole ratio of the sulfur with respect to the zinc (S/Zn) may be greater than or equal to about 0.1:1, for example, greater than or equal to about 0.2:1, greater than or equal to about 0.25:1, or greater than or equal to about 0.3:1 and less than or equal to about 1:1, for example, less than or equal to about 0.9:1, less than or equal to about 0.8:1, less than or equal to about 0.7:1, or less than or equal to about 0.6:1.

In the semiconductor nanocrystal particle of an embodiment, the amount of the selenium may be greater than that of the sulfur. In the semiconductor nanocrystal particle of an embodiment, a mole ratio of the sulfur with respect to the selenium (S/Se) may be greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.9:1, or greater than or equal to about 1:1. In the semiconductor nanocrystal particle of an embodiment, a mole ratio of the sulfur with respect to the selenium (S/Se) may be less than or equal to about 2:1, for example, less than or equal to about 1.9:1, less than or equal to about 1.8:1, less than or equal to about 1.7:1, or less than or equal to about 1.65:1. In an embodiment, a mole ratio of the sulfur with respect to the selenium (S/Se) may be less than or equal to about 1:1.

In the semiconductor nanocrystal particle of an embodiment, a mole ratio of a sum of the sulfur and the selenium with respect to the zinc may be greater than or equal to about 0.5:1, greater than or equal to about 0.6:1, greater than or equal to about 0.7:1, or greater than or equal to about 0.8:1 and less than or equal to about 1.5:1, less than or equal to about 1:1, or less than or equal to about 0.9:1.

In the semiconductor nanocrystal particle, the amount of each element and a mole ratio therebetween may be determined via an appropriate means such as an inductively coupled plasma elemental emission spectroscopy.

A thickness of the first shell may be greater than or equal to about 3 monolayers, for example, greater than or equal to about 4 monolayers, greater than or equal to about 5 monolayers, greater than or equal to about 6 monolayers, greater than or equal to about 7 monolayers, or greater than or equal to about 8 monolayers. A thickness of the first shell may be less than or equal to about 15 monolayers, for example, less than or equal to about 12 monolayers, or less than or equal to about 10 monolayers.

Figure 2:
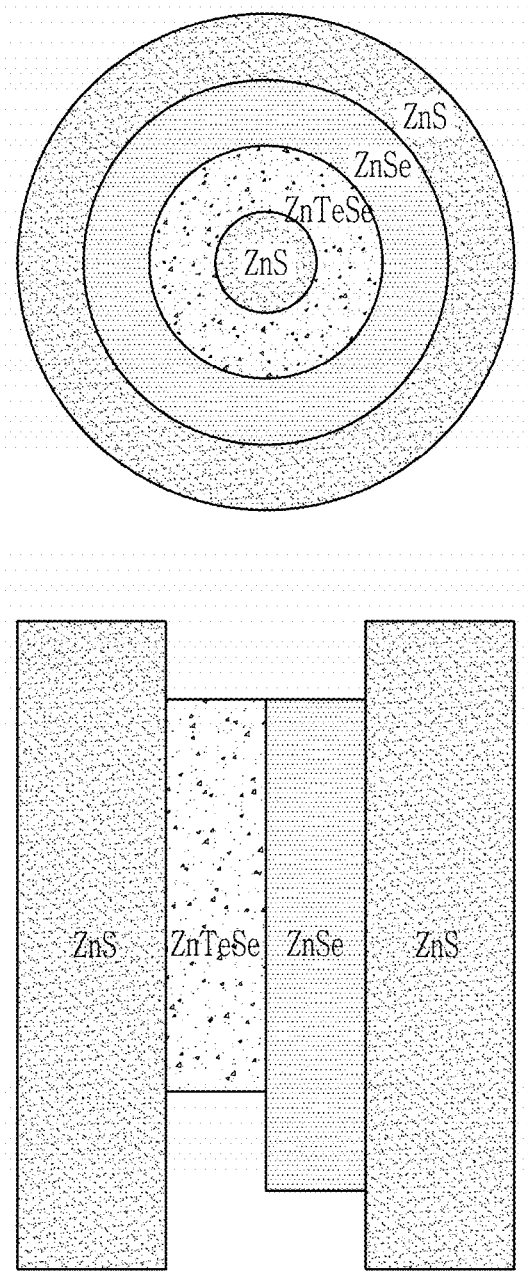
FIG. 2 is a schematic cross-sectional view and a schematic energy band structure of a semiconductor nanocrystal particle of an embodiment

In a semiconductor nanocrystal particle of an embodiment, a second shell including a third semiconductor nanocrystal is disposed on the first shell, wherein the third semiconductor nanocrystal has a different composition from that of the second semiconductor nanocrystal. The second shell may be the outermost layer of the semiconductor nanocrystal particle. In an embodiment, the semiconductor nanocrystal particle may include a ZnS based core (e.g., a core including or essentially consisting of zinc sulfide) and a multi-layered shell of $ZnSe_{1-x}Te_x$/ZnS, wherein x is greater than or equal to about 0 and less than or equal to about 1, being disposed on the core. In an embodiment, the semiconductor nanocrystal particle may be a ZnS based core and a multi-layered shell of $ZnSe_{1-x}Te_x$/ZnSe/ZnS, wherein x is greater than 0 and less than or equal to about 1, being disposed on the core. In an embodiment, the semiconductor nanocrystal particle may be a ZnSeS based core and a multi-layered shell of $ZnSe_{1-x}Te_x$/ZnS, wherein x is greater than or equal to about 0 and less than or equal to about 1, being disposed on the core By having the aforementioned structure of the core and the multi-layered shell, a semiconductor nanocrystal particle of an embodiment may show a photoluminescent peak wavelength within a desired range (e.g., in a blue range) and also have an enhanced level of quantum efficiency and a FWHM of less than or equal to about 30 nm. In addition, even when the semiconductor nanocrystal particle has an increased size due to the formation of the shell, the particles may show uniform morphology, which may be favorable to the film formation and thereby the application of the semiconductor nanocrystals to a device may be facilitated. The structure and the band alignment of the semiconductor nanocrystal particle will be explained referring to the figure as below. In the figure, the cross-section of the semiconductor nanocrystal particle is illustrated as a circle, but is not limited thereto. The semiconductor nanocrystal particle of an embodiment may have various cross-sections such as polygons. Referring to FIG. 1, a semiconductor nanocrystal particle of an embodiment may have a core of a relatively wide bandgap (e.g., a ZnS based core), and a first shell of a bandgap narrower than that of the core (e.g., a ZnSe, ZnSeS, or ZnSeTe layer or a combination thereof) may be disposed on the core. On or over the first shell, a second shell having a relatively wide bandgap (for example, including ZnS or ZnSeS) may be disposed. Referring to FIG. 2, a semiconductor nanocrystal particle of an embodiment may have a core of a relatively wide bandgap (e.g., a ZnS or ZnSeS based core), and on the core, a first shell having a bandgap narrower than that of the core (e.g., including ZnSe or ZnSeTe) may be disposed. On or over the first shell, a second shell of a bandgap wider than that of the first shell (e.g., a ZnS or ZnSeS shell) may be disposed.

A maximum photoluminescent peak of the semiconductor nanocrystal particle of an embodiment may have a photoluminescent wavelength of a desired range (e.g., a blue range) together with a relatively narrow FWHM. By having the aforementioned structure, the semiconductor nanocrystal particle of an embodiment may show enhanced solution stability and thus a phenomenon of a decrease in the luminous efficiency of the nanocrystal in the solution may suppressed/reduced. Without wishing to be bound by a theory, it is believed that in the semiconductor nanocrystal particle of the embodiment, a photoluminescent peak wavelength of a final semiconductor nanocrystal particle may be substantially changed by the composition and/or the thickness of the first shell, and the wide energy bandgap of the second shell may sufficiently cover the energy bandgap of the first shell and may effectively confine the excited electrons and/or holes within the first shell. The semiconductor nanocrystal particle of the embodiment may include a relatively thick shell uniformly grown and having alleviated lattice mismatch. Thus, a film including the semiconductor nanocrystal particle of the embodiment may show improved morphology (e.g., in terms of uniformity).

The semiconductor nanocrystal particles of the embodiment may have a relatively constant particle shape even when they have a size (e.g., an average size) of greater than or equal to about 8 nm or greater than or equal to about 9 nm for example determined by a transmission electron microscopic image. When the semiconductor nanocrystal particles of the embodiment form a film, the resulting film may show improved uniformity of the film morphology.

The thickness of the second shell may be greater than or equal to about 1 monolayer (ML), for example, greater than or equal to about 2 ML and less than or equal to about 11 monolayers (ML), for example, less than or equal to about 10 ML, less than or equal to about 9 ML, less than or equal to about 8 ML, less than or equal to about 7 ML, less than or equal to about 6 ML, less than or equal to about 5 ML, less than or equal to about 4 ML, or less than or equal to about 3 ML.

The semiconductor nanocrystal particle (hereinafter, also referred to as a quantum dot) may include various shapes. The quantum dot may include a spherical shape, a polygonal shape, a multipod shape, or a combination thereof. A size (e.g., an average size) of the quantum dot may be greater than or equal to about 3 nm, for example greater than or equal to about 4 nm, greater than or equal to about 5 nm, or greater than or equal to about 6 nm. The size of the semiconductor nanocrystal may be less than or equal to about 50 nm, for example less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm. Herein, when the semiconductor nanocrystal particle has a spherical shape, the size of the semiconductor nanocrystal may be a diameter. When the quantum dot is a non-spherically shaped particle, the size of the quantum dot may be a diameter of a circle of equivalent area calculated from a two dimensional area of an electron microscopic image of the particle. The size of the semiconductor nanocrystal particle (or the core) may be determined by for example, a Transmission Electron Microscopic analysis, but it is not limited thereto.

The quantum dots of an embodiment may emit blue light having a maximum photoluminescence peak at a wavelength of greater than or equal to about 420 nm (for example, greater than or equal to about 430 nm, greater than or equal to about 433 nm, greater than or equal to about 440 nm, greater than or equal to about 445 nm, or greater than or equal to about 450 nm) and less than or equal to about 470 nm (for example, less than about 470 nm, less than or equal to about 465 nm, or less than or equal to about 460 nm). The maximum PL peak may be present in a range of greater than or equal to about 416 nm and less than or equal to about 460 nm. The blue light may have a maximum luminous peak wavelength of from about 450 nm to about 460 nm. The semiconductor nanocrystal particle may show a maximum PL peak in a range of greater than or equal to about 450 nm and less than or equal to about 500 nm.

The quantum dots of an embodiment may emit green light having a maximum photoluminescence peak at a wavelength of greater than or equal to about 500 nm (for example, greater than or equal to about 510 nm, or greater than or equal to about 520 nm) and less than or equal to about 560 nm (for example, less than or equal to about 550 nm, or less than or equal to about 540 nm). The green light may have a maximum luminous peak wavelength of from about 520 nm to about 540 nm.

The maximum luminous peak may have a FWHM of less than or equal to about 50 nm, for example, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

The semiconductor nanocrystal particle may have a quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, greater than or equal to about 69%, or greater than or equal to about 70%. The semiconductor nanocrystal particle may have a quantum efficiency of greater than or equal to about 80%, greater than or equal to about 90%, greater than or equal to about 95%, greater than or equal to about 99%, or about 100%.

The semiconductor nanocrystal particle may be prepared by the following method, and may include an organic ligand coordinating to a surface of the particle, which will be described below.

In an embodiment, a method of producing the semiconductor nanocrystal particle according to an embodiment includes, providing a core particle including a core including a first semiconductor nanocrystal;

conducting a reaction between a second metal precursor and a second non-metal precursor of a second semiconductor nanocrystal in the presence of the core particle and an organic ligand in an organic solvent to form a first shell including the second semiconductor nanocrystal on the core particle;

adding a third metal precursor and a third non-metal precursor of a third semiconductor nanocrystal to the reaction solution to conduct a reaction therebetween to obtain a semiconductor nanocrystal particle having a second shell including the third semiconductor nanocrystal formed on the first shell.

The providing of the core may include conducting a reaction between a first metal precursor and a first non-metal precursor of a first semiconductor nanocrystal in the presence of an organic ligand in an organic solvent. The providing of the core may include separating a synthesized core from a reaction product.

Details for the core, the first shell, and the second shell are the same as set forth above.

The first metal/non-metal precursor, the second metal/non-metal precursor, and the third metal/non-metal precursor may be selected depending on the first semiconductor nanocrystal, the second semiconductor nanocrystal, and the third semiconductor nanocrystal, respectively.

In an embodiment, the first metal precursor and the third metal precursor, and optionally the second metal precursor may include a zinc precursor.

The zinc precursor may include a Zn powder, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate, a Zn nitrate, a Zn perchlorate, a Zn sulfate, a Zn acetylacetonate, a Zn halide, a Zn cyanide, a Zn hydroxide, ZnO, a zinc peroxide, a zinc carbonate, or a combination thereof. Examples of the zinc precursor may include, but are not limited to, a carboxylic zinc compound having a long aliphatic chain such as zinc oleate, zinc stearate, and the like, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and a combination thereof. For the formation of the core and/or shell, the zinc precursor may include a zinc carboxylate (e.g., zinc acetate), an alkyl zinc (e.g., diethyl zinc), or a combination thereof.

The first non-metal precursor may include a sulfur precursor and optionally a selenium precursor. The third non-metal precursor may include a sulfur precursor. The second non-metal precursor may include a selenium precursor and optionally a tellurium precursor. The third non-metal precursor may not include a selenium precursor, a tellurium precursor, or both. The second non-metal precursor may not include a sulfur precursor.

The selenium precursor, the sulfur precursor, and the tellurium precursor may be selected appropriately.

In an embodiment, the selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

In an embodiment, the tellurium precursor may include tellurium-tributylphosphine (Te-TBP), tellurium-triphenylphosphine (Te-TPP), tellurium-diphenylphosphine (Te-DPP), tellurium-trioctylphosphine (Te-TOP), or a combination thereof, but is not limited thereto.

In an embodiment, the sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

Types of the first metal/non-metal precursor, the second metal/non-metal precursor, and the third metal/non-metal precursor may be selected appropriately considering the composition of the final semiconductor nanocrystal particle and the reactivity between the precursors.

The organic ligand may coordinate to, e.g., be bound to, the surface of the produced nanocrystal and may have an effect on the light emitting and electric characteristics as well as may effectively disperse the nanocrystal in the solution phase. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, RHPOOH, or a combination thereof, wherein, each R is the same or different and is independently a substituted or unsubstituted C1 to C40 aliphatic hydrocarbon group, a substituted or unsubstituted C6 to C40 aromatic hydrocarbon group, or a combination thereof. One or more ligands may be used.

Examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methyl phosphine, ethyl phosphine, propyl phosphine, butyl phosphine, pentyl phosphine, tributylphosphine, or trioctylphosphine, a phosphine oxide compound such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, phosphinic acid, or the like, but are not limited thereto. One or more organic ligand compounds may be used. In an embodiment, the organic ligand compound may be a combination of RCOOH and an amine (e.g., $RNH_2$, $R_2NH$, and/or $R_3N$).

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g., trioctylphosphine oxide) substituted with at least one (e.g., 1, 2, or 3) C6 to C22 alkyl group, a C12 to C22 aromatic ether such as a phenyl ether or a benzyl ether, or a combination thereof.

Reaction conditions such as a reaction temperature and/or time for core and/or shell formation is not particularly limited and may be selected appropriately. In an embodiment, under a vacuum, an organic solvent and optionally an organic ligand are heated (or vacuum-treated) at a predetermined temperature (e.g., greater than or equal to about 100° C.), and are heated again at predetermined temperature (e.g., greater than or equal to about 100° C.) after the atmosphere is replaced with an inert gas. Subsequently, the core and/or the metal and/or non-metal precursor is (are) added thereto in any suitable order or simultaneously, and a reaction is conducted at a predetermined reaction temperature. The shell precursors may be sequentially added in the form of a mixture having different ratios during the reaction time. The reaction temperature may be selected appropriately and is not particularly limited. For example, the reaction temperature for the production of the core may be greater than or equal to about 260° C., greater than or equal to about 270° C., greater than or equal to about 280° C., greater than or equal to about 290° C., greater than or equal to about 295° C., greater than or equal to about 300° C., greater than or equal to about 310° C., greater than or equal to about 325° C., greater than or equal to about 330° C., or greater than or equal to about 335° C. and less than or equal to about 340° C., for example, less than or equal to about 335° C., less than or equal to about 330° C., less than or equal to about 325° C. The reaction temperature for the formation of the first and second shells may be greater than or equal to about 260° C., greater than or equal to about 270° C., greater than or equal to about 280° C., greater than or equal to about 290° C., or greater than or equal to about 295° C. and less than or equal to about 340° C., for example, less than or equal to about 335° C., less than or equal to about 330° C., or less than or equal to about 325° C.

After completing the reaction, a nonsolvent is added to reaction products and nanocrystal particles coordinated with the ligand compound may be separated (e.g., precipitated). The nonsolvent may be a polar solvent that is miscible with the organic solvent used in the core formation and/or shell formation reactions and is not capable of dispersing the produced nanocrystals therein. The nonsolvent may be selected depending the organic solvent used in the reaction and may be for example acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing listed non-solvents, or a combination thereof. The nanocrystal particles may be separated through centrifugation, sedimentation, chromatography, or distillation. The separated nanocrystals may be added to a washing solvent and washed, if necessary. The washing solvent has no particular limit and may have a similar solubility parameter to that of the ligand and may, for example, include hexane, heptane, octane, chloroform, toluene, benzene, or the like.

In an embodiment, an electronic device includes the semiconductor nanocrystal particle. The device may include a display device, a light emitting diode (LED), an organic light emitting diode (OLED), a semiconductor nanocrystal particle LED, a sensor, a solar cell, an image sensor, or a liquid crystal display (LCD), but is not limited thereto. In an embodiment, the electronic device may be a photoluminescence element (e.g., a lighting such as a semiconductor nanocrystal particle sheet or a semiconductor nanocrystal particle rail or a liquid crystal display (LCD)) or an electroluminescent device (e.g., QD LED). In an embodiment, the electronic device may include a semiconductor nanocrystal particle sheet and the semiconductor nanocrystal particle may be included in the semiconductor nanocrystal particle sheet (e.g., in a form of a semiconductor nanocrystal-polymer composite).

In an embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 3).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, calcium), a metal compound (e.g., LiF), an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may include, for example, a transparent conductor such as indium tin oxide (ITO) or indium zinc oxide (IZO), gallium indium tin oxide, zinc indium tin oxide, titanium nitride, polyaniline, or LiF/Mg: Ag, or a metal thin film of a thin monolayer or multilayer, but is not limited thereto. When one of the cathode and the anode is a non-light transmitting electrode, it may include, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 μm, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to an embodiment. The quantum dot emission layer may include a monolayer of the blue light emitting semiconductor nanocrystal particles.

The quantum dot emission layer may be formed by preparing a dispersion including the quantum dots dispersed in a solvent, applying the dispersion via spin coating, ink jet coating, or spray coating, and drying the same. The emissive layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

Figure 3:
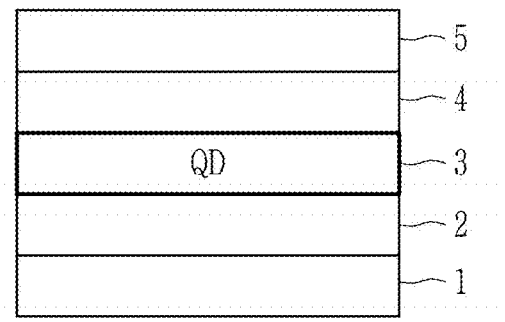
FIG. 3 is a schematic cross-sectional view showing a quantum dot (QD) light emitting diode (LED) device according to an embodiment.

The electronic device may include charge (hole or electron) auxiliary layers between the anode and the cathode. For example, as shown in FIG. 3, the electronic device may include a hole auxiliary layer 2 between the anode and the quantum dot emission layer and/or an electron auxiliary layer 4 between the cathode and the semiconductor nanocrystal particle emission layer.

In the figures, the electron/hole auxiliary layer is formed as a single layer, but it is not limited thereto and may include a plurality of layers including at least two stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer that is formed by a solution process (e.g., spin coating etc.) such as PEDOT: PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The electron injection layer may be an organic layer formed by deposition (e.g., vapor deposition). The electron transport layer may include an inorganic oxide or nano (or fine) particles thereof or may include an organic layer formed by deposition.

The quantum dot emission layer may be disposed in or on the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer may include, each independently, for example poly(3, 4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole, PVK), polyaniline, polypyrrole, N,N,N',N'-tetrakis (4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), p-type metal sulfide (e.g., ZnS), a carbonaceous material such as graphene oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) and/or the electron injection layer (EIL) may, each independently, include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), or a combination thereof, but is not limited thereto. The n-type metal oxide may be (crystalline) nanoparticles. The electron transport layer (ETL) may include crystalline nanoparticles including a zinc oxide compound (e.g., ZnO, ZnMgO, and the like) or $HfO_2$.

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

In the foregoing "q" is 8-hydroxyquinoline, "BTZ" is 2-(2-hydroxyphenyl)benzothiazolate, and "Bq" is 10-hydroxybenzo[h]quinoline.

Figure 4:
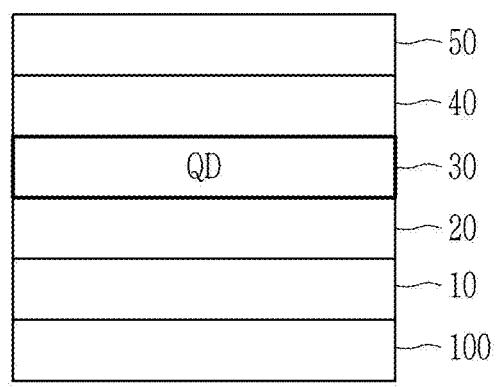
FIG. 4 is a schematic cross-sectional view showing a QD LED device according to an embodiment.

A device according to an embodiment as shown in FIG. 4 may have a normal structure (e.g., a non-inverted structure). In the device, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. For example, a hole auxiliary layer 20 (e.g., a hole transport layer including TFB and/or PVK and/or a hole injection layer including PEDOT:PSS and/or a p-type metal oxide) may be disposed between the transparent electrode 10 and the emission layer 30. An electron auxiliary layer (e.g., electron transport layer) 40 may be disposed between the quantum dot emission layer 30 and the cathode 50.

Figure 5:
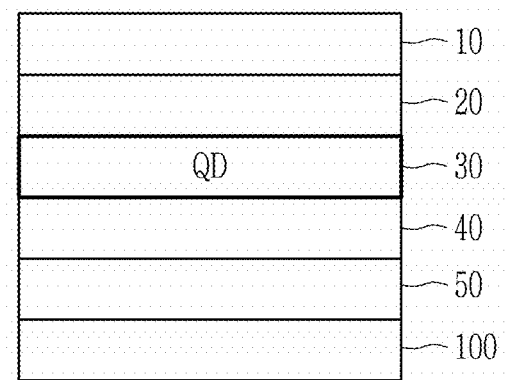
FIG. 5 is a schematic cross-sectional view showing a QD LED device according to an embodiment.

A device according to an embodiment as shown in FIG. 5 has an inverted structure. In the device of an embodiment, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB and/or PVK and/or a hole injection layer including $MoO_3$ or another p-type metal oxide) may be disposed between the metal anode 10 and the quantum dot emission layer 30. Hereinafter, examples are illustrated. However, these examples are exemplary, and the present disclosure is not limited thereto.

Hereinafter, specific examples are illustrated. However, these examples are exemplary, and the present disclosure is not limited thereto.

EXAMPLES

Analysis Method
1. Photoluminescence Analysis

Photoluminescence (PL) spectra of the produced nanocrystals are obtained using a Hitachi F-7000 spectrometer at an irradiation wavelength of 372 nanometers (nm).
2. Ultraviolet (UV) Spectroscopy Analysis A UV spectroscopy analysis is performed by using a Hitachi U-3310 spectrometer to obtain a UV-Visible absorption spectrum.
3. Transmission Electron Microscope (TEM) Analysis Transmission electron microscope photographs of nanocrystals are obtained using an UT F30 Tecnai electron microscope.
4. Inductively Coupled Plasma-Atomic Emission Spectroscopy (ICP-AES) Analysis An inductively coupled plasma-atomic emission spectroscopy (ICP-AES) analysis is performed using Shimadzu ICPS-8100.

A synthesis is performed under an inert gas atmosphere (nitrogen flowing condition) unless particularly mentioned.

Example 1: ZnS/ZnSe/ZnS

Selenium and sulfur are dispersed in trioctylphosphine (TOP) to prepare a 1 molar (M) Se/TOP solution and a 1 M S/TOP solution, respectively. A hexane solution of 1 M diethyl zinc is purchased from Sigma Aldrich Co., Ltd.

1. In a 300 milliliter (mL) reaction flask, an organic ligand including oleic acid and the diethylzinc stock solution are dissolved in trioctylamine and heated to 120° C. under vacuum. The atmosphere in the flask is changed into an inert gas, and then S/TOP stock solution is injected and the mixture is heated at 300° C. and the reaction proceeds for 40 minutes.

After the reaction, the reaction solution is rapidly cooled down to room temperature, ethanol is added thereto, and the obtained mixture is centrifuged to recover ZnS core particles. The recovered ZnS core particles are dispersed in toluene.

A mole ratio (hereinafter, also referred to as a ratio) between the used amounts of the zinc precursor and the sulfur precursor (Zn:S) is about 2:1.

A transmission electron microscopic analysis is made for the core particles and the results confirm that the obtained core particles have a generally spherical shape and an average size thereof is about 2.6 nm. An ultraviolet-visible (UV-Vis) absorption spectroscopic analysis and a photoluminescent spectroscopic analysis are made and the results are shown in Table 1.

2. In a 300 milliliter (mL) reaction flask, trioctylamine is placed and zinc acetate and oleic acid are added thereto and vacuum-treated at 120° C. The atmosphere in the flask is changed into nitrogen ($N_2$). While the flask is heated to a reaction temperature that is greater than 300° C., a toluene dispersion of the ZnS core is injected quickly and then a Zn precursor (e.g., a hexane solution of 1 M diethyl zinc) and Se/TOP stock solution are added thereto several times. The reaction proceeds 1 hour to form a ZnSe layer on the core. Then, the Zn precursor and the S/TOP are added and the reaction proceeds for 50 minutes to form a ZnS layer on the ZnSe layer. A ratio among the Zn precursor:the Se precursor: and the S precursor is about 5:2:3.

After the reaction, the reaction solution is rapidly cooled down to room temperature, ethanol is added thereto, and the obtained mixture is centrifuged to recover core-shell particles. The recovered core-shell particles are dispersed in an organic solvent (e.g., toluene or octane).

Figure 6:
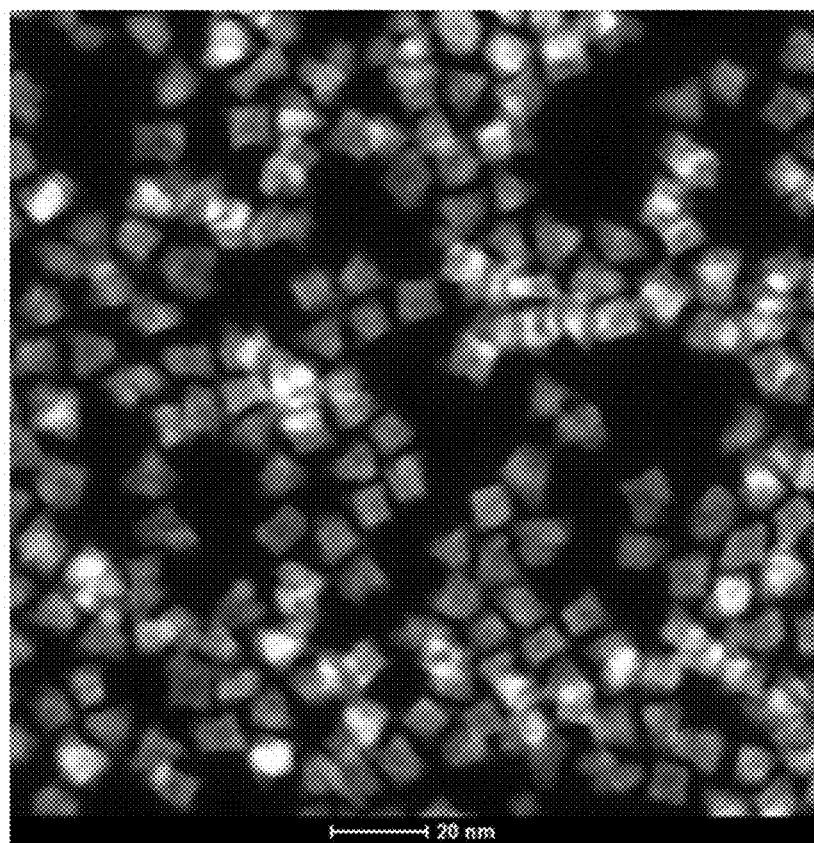
FIG. 6 shows a transmission electron microscope (TEM) image of the semiconductor nanocrystal particle (ZnS/ZnSeTe/ZnS) produced in Example 1.
Figure 7:
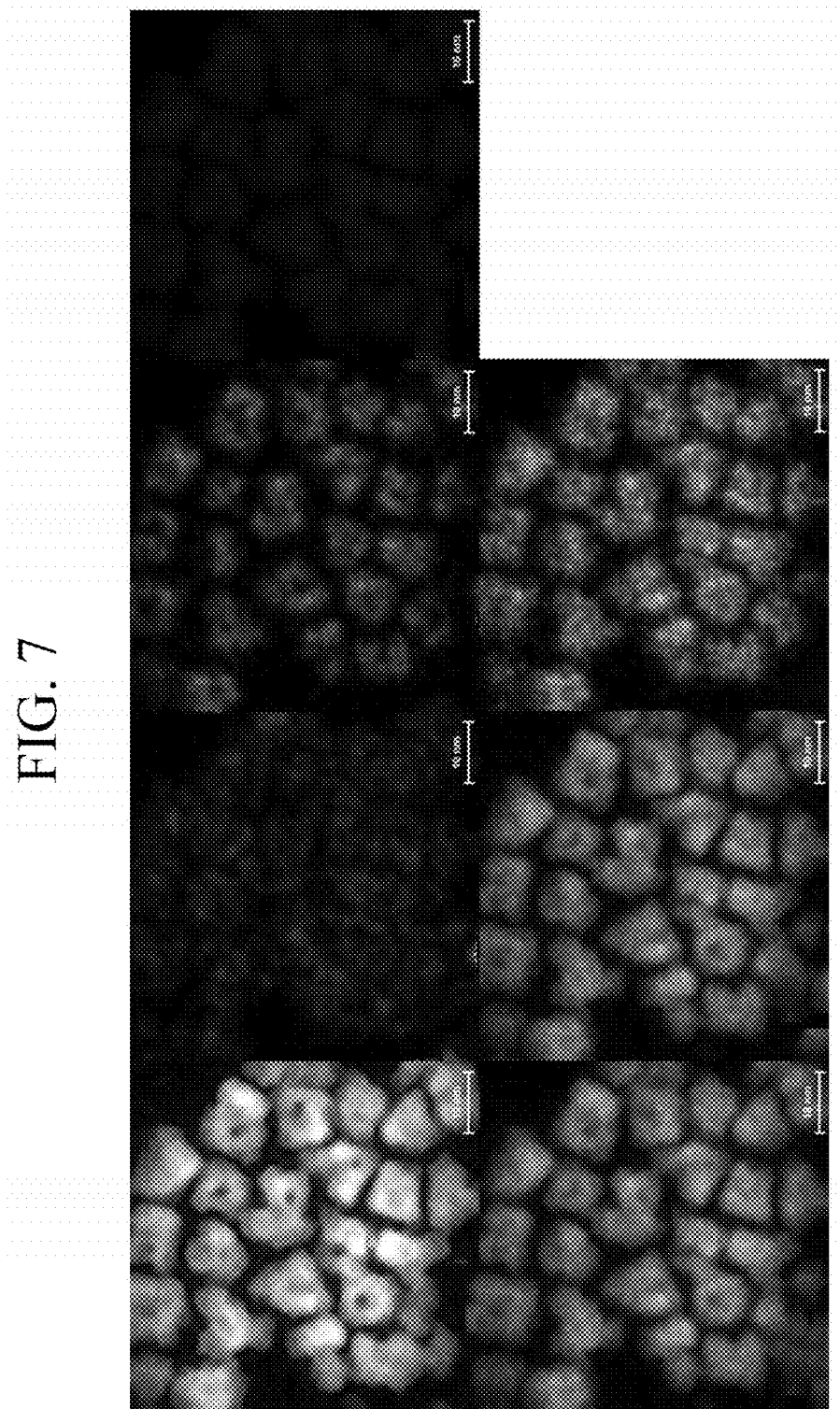
FIG. 7 is a view showing results of High-Angle Annular Dark-Field (HAADF)-Energy Dispersive X-ray Spectroscopy (EDS) mapping of the semiconductor nanocrystal particle produced in Example 1.
Figure 8:
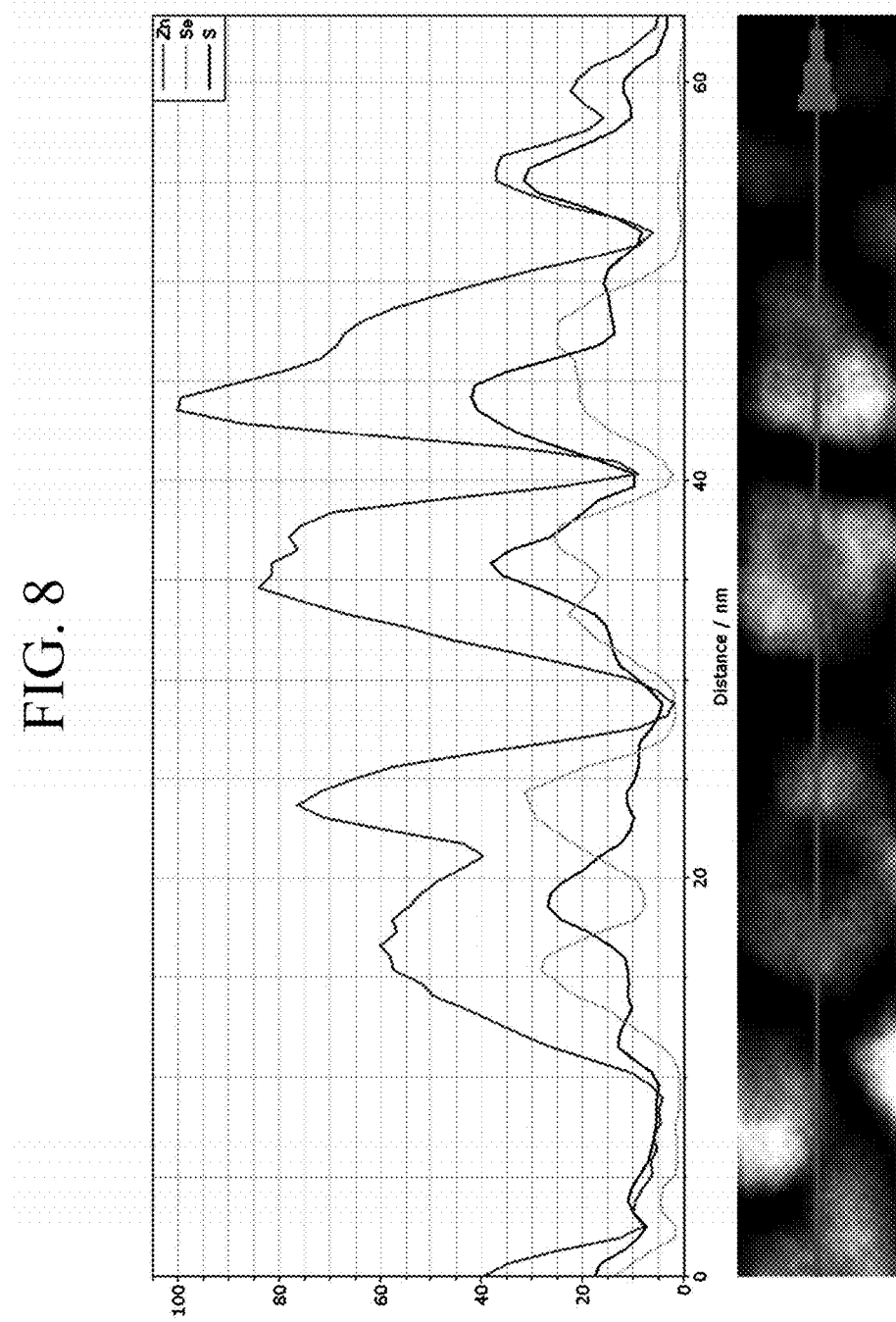
FIG. 8 is a graph showing image strength of the results of EDS mapping of the semiconductor nanocrystal particle produced in Example 1.

3. A transmission electron microscopic analysis and an energy dispersive X-ray spectroscopic analysis are carried out for the prepared semiconductor nanocrystal particles and the results are shown in FIG. 6, FIG. 7, and FIG. 8. The TEM analysis results confirm that the size of the semiconductor nanocrystal particles is about 9.5±0.7 nm and the shape distribution of the semiconductor nanocrystal particles is uniform. The Energy Dispersive X-ray Spectroscopy (EDS) analysis and the image strength analysis results confirm that the prepared semiconductor nanocrystal particles have the ZnS core and the ZnS outermost layer.

4. A UV-Vis spectroscopic analysis and a photoluminescent spectroscopic analysis are made for the prepared semiconductor nanocrystal particles and the results are shown in Table 1.

An inductively coupled plasma atomic emission spectroscopic analysis is made for the obtained semiconductor nanocrystal particles and the results are shown in Table 2.

Example 2: ZnS/ZnSeTe/ZnSe/ZnS

A selenium precursor solution, a sulfur precursor solution, and a zinc precursor solution are prepared in the same manner as set forth in Example 1. Tellurium is dispersed in trioctylphosphine (TOP) to prepare a 0.1 M Te/TOP stock solution.

1. A ZnS core is prepared in the same manner as set forth in Example 1.

2. In a 300 milliliter (mL) reaction flask, trioctylamine is placed and zinc acetate and oleic acid are added thereto and vacuum-treated at 120° C. The atmosphere in the flask is changed into nitrogen ($N_2$). While the flask is heated to a reaction temperature, a toluene dispersion of the ZnS core is injected quickly and then, together with the Zn stock solution, the Se/TOP stock solution and the Te/TOP stock solution are added thereto several times. The reaction proceeds at least 1 hour to form a ZnTeSe layer on the core. Then, the Se/TOP together with the Zn stock solution is added thereto and the reaction proceeds for 20 minutes to form a ZnSe layer, and the S/TOP together with the Zn stock solution is added thereto and the reaction proceeds for 50 minutes to form a ZnS layer on the ZnSe layer.

A ratio among the Zn precursor:the Se precursor:the S precursor:the Te precursor is about 5:2:3:0.01.

After the reaction, the reaction solution is rapidly cooled down to room temperature, ethanol is added thereto, and the obtained mixture is centrifuged to recover core-shell particles. The recovered core-shell particles are dispersed in an organic solvent (e.g., toluene or octane).

Figure 9:
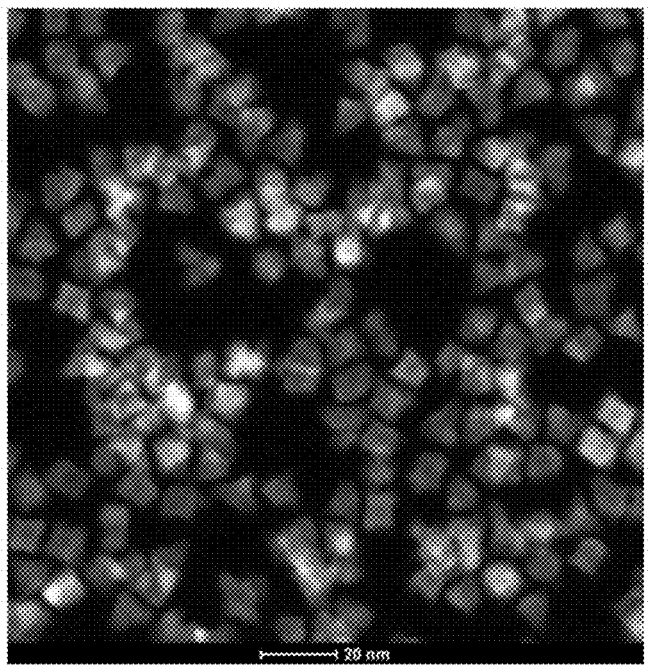
FIG. 9 shows a transmission electron microscope (TEM) image of the semiconductor nanocrystal particle (ZnS/ZnTeSe/ZnSe/ZnS) produced in Example 2.

3. A transmission electron microscopic analysis is carried out for the prepared semiconductor nanocrystal particles and the results are shown in FIG. 9. The TEM analysis results confirm that the size of the semiconductor nanocrystal particles is about 9.9±0.6 nm and the shape distribution of the semiconductor nanocrystal particles is uniform. The EDS analysis and the image strength analysis results confirm that the prepared semiconductor nanocrystal particles have the ZnS core and the ZnS outermost shell layer.

A UV-Vis spectroscopic analysis and a photoluminescent spectroscopic analysis are made for the prepared semiconductor nanocrystal particles and the results are shown in Table 1.

An inductively coupled plasma atomic emission spectroscopic analysis is made for the obtained semiconductor nanocrystal particles and the results are shown in Table 2.

TABLE 1

| | photoluminescence (at 372 nm) | | |
|---|---|---|---|
| | Center wavelength | Full Width at Half Maximum (FWHM) | Quantum Yield (QY) |
| ZnS core | — | — | — |
| Example 1 | 416 nm | 19 nm | 100% |
| Example 2 | 438 nm | 20 nm | 80% |

The results confirm that the core does not show luminous properties, but the formation of the shell makes it possible for the quantum dot to have significantly improved photoluminescent properties (e.g., emitting blue light with a narrow FWHM and high QY).

TABLE 2

| | Mole ratio | | | | | |
|---|---|---|---|---|---|---|
| | S | Zn | Se | Te | (Se + S)/Zn | S/Se |
| Example 1 | 0.52 | 1.00 | 0.32 | 0.000 | 0.84 | 1.625 |
| Example 2 | 0.51 | 1.00 | 0.36 | 0.003 | 0.87 | 1.42 |

Comparative Example 1: ZnTeSe/ZnSe/ZnS

A selenium precursor solution, a sulfur precursor solution, and a zinc precursor solution are prepared in the same manner as set forth in Example 1. Tellurium is dispersed in trioctylphosphine (TOP) to prepare a 0.1 M Te/TOP stock solution.

1. In a 300 milliliter (mL) reaction flask, an organic ligand including oleic acid and the diethylzinc stock solution are dissolved in trioctylamine and heated to 120° C. under vacuum. The atmosphere in the flask is changed into an inert gas, and then the Se/TOP stock solution and the Te/TOP stock solution are injected at a ratio of Te/Se=1/25 and the mixture is heated at 300° C. and the reaction proceeds for 40 minutes.

After the reaction, the reaction solution is rapidly cooled down to room temperature, ethanol is added thereto, and the obtained mixture is centrifuged to recover ZnTeSe core particles. The recovered ZnTeSe core particles are dispersed in toluene.

2. A multi-layered shell is formed in the same manner as set forth in example 1 except for using the ZnSeTe core prepared above and not forming the ZnSeTe shell on the core. After the reaction, the reaction solution is rapidly cooled down to room temperature, ethanol is added thereto, and the obtained mixture is centrifuged to recover core-shell particles. The recovered core-shell particles are dispersed in an organic solvent (e.g., toluene or octane).

Comparative Example 2: ZnSe/ZnS

A selenium precursor solution, a sulfur precursor solution, and a zinc precursor solution are prepared in the same manner as set forth in Example 1.

1. In a 300 milliliter (mL) reaction flask, an organic ligand including oleic acid and the diethylzinc stock solution are dissolved in trioctylamine and heated to 120° C. under vacuum. The atmosphere in the flask is changed into an inert gas, and then the Se/TOP stock solution is injected and the mixture is heated at 300° C. and the reaction proceeds for 40 minutes.

After the reaction, the reaction solution is rapidly cooled down to room temperature, ethanol is added thereto, and the obtained mixture is centrifuged to recover ZnSe core particles. The recovered ZnSe core particles are dispersed in toluene.

A ratio among the Zn precursor:the Se precursor:the Te precursor is about 2:1.

2. In a 300 milliliter (mL) reaction flask, trioctylamine is placed and zinc acetate and oleic acid are added thereto and vacuum-treated at 120° C. The atmosphere in the flask is changed into nitrogen ($N_2$). While the flask is heated to a reaction temperature, a toluene dispersion of the ZnSe core is injected quickly and then the S/TOP stock solution is added thereto. The reaction proceeds about 1 hour to form a ZnS layer on the core.

A ratio among the Zn precursor:the S precursor is about 1:2.

After the reaction, the reaction solution is rapidly cooled down to room temperature, ethanol is added thereto, and the obtained mixture is centrifuged to recover core-shell particles. The recovered core-shell particles are dispersed in an organic solvent (e.g., toluene or octane).

Experimental Example 1: Evaluation of Solution Stability

A photoluminescent efficiency is measured at the excitation light wavelength of 372 nm for each of the toluene dispersion of the semiconductor nanocrystal particles prepared in Example 2, the toluene dispersion of the semiconductor nanocrystal particles prepared in Comparative Example 1, and the toluene dispersion of the semiconductor nanocrystal particles prepared in Comparative Example 2. After the dispersions are left in air at a temperature of about 25° C., a PL efficiency of each of them is measured respectively. The results confirm that the semiconductor nanocrystal particles prepared in Example 2 may have a maintenance ratio of the PL efficiency 2.5 times and 2 times higher than a maintenance ratio of the PL efficiency of the semiconductor nanocrystal particles prepared in Comparative Example 2 and Comparative Example 1, respectively.

Experimental Example 2: Thin Film Formation

Each of the octane dispersion of the semiconductor nanocrystal particles prepared in Example 1 and the octane dispersion of the semiconductor nanocrystal particles prepared in Comparative Example 2 is spin-coated on a glass substrate to form a layer of the quantum dots. The layers of the quantum dots are observed with a transmission electron microscope and the results are shown in FIG. 10 (for the semiconductor nanocrystal particles prepared in Example 1) and FIG. 11 (for the semiconductor nanocrystal particles prepared in Comparative Example 2), respectively.

Figure 10:
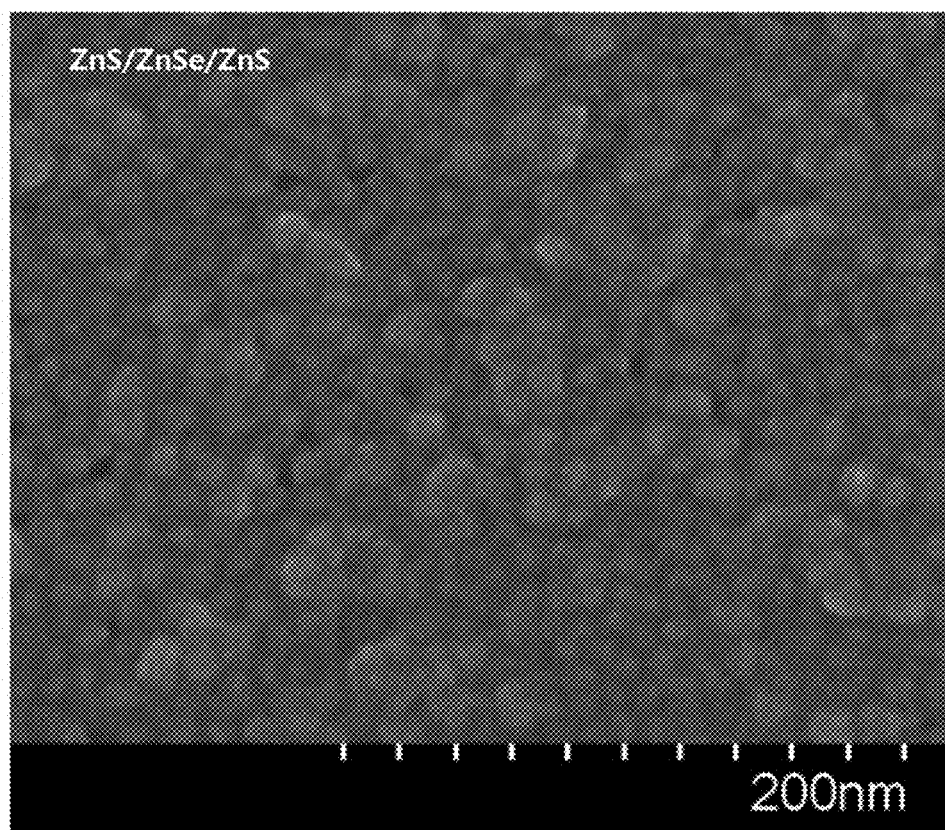
FIG. 10 shows a transmission electron microscope (TEM) image of a thin film formed of the semiconductor nanocrystal (ZnSe/ZnS) particles prepared in Example 1.
Figure 11:
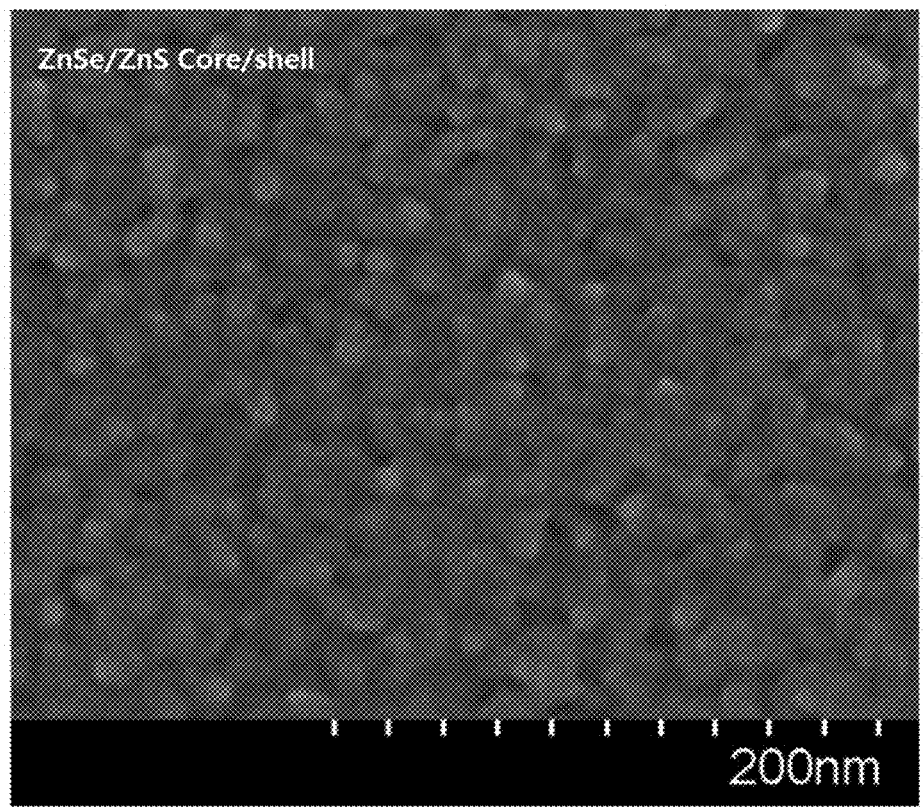
FIG. 11 shows a transmission electron microscope (TEM) image of a thin film formed of the semiconductor nanocrystal particles prepared in Comparative Example 2.

The results of FIG. 10 and FIG. 11 confirm that the thin film of the semiconductor nanocrystal particles of Example 1 may show improved uniformity in comparison with that of the semiconductor nanocrystal particles of Comparative Example 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor nanocrystal particle comprising:
   a core comprising a first semiconductor nanocrystal,
      a first shell surrounding the core, the first shell comprising a second semiconductor nanocrystal that has a different composition from the first semiconductor nanocrystal, and
      a second shell surrounding the first shell, the second shell comprising a third semiconductor nanocrystal that has a different composition from the second semiconductor nanocrystal,
   wherein the first semiconductor nanocrystal comprises zinc and sulfur;
   wherein the second semiconductor nanocrystal comprises zinc and selenium;
   wherein the third semiconductor nanocrystal comprises zinc and sulfur;
   wherein an energy bandgap of the second semiconductor nanocrystal is less than an energy bandgap of the first semiconductor nanocrystal, and the energy bandgap of the second semiconductor nanocrystal is less than an energy bandgap of the third semiconductor nanocrystal;
   wherein the semiconductor nanocrystal particle does not comprise cadmium; and
   wherein
      a maximum photoluminescent peak of the semiconductor nanocrystal particle is present in a range between about 400 nanometers and about 500 nanometers, wherein the semiconductor nanocrystal particle is configured to exhibit a quantum efficiency of greater than or equal to about 60% and optionally a full width at half maximum of less than or equal to about 40 nanometers.

2. The semiconductor nanocrystal particle of claim 1, wherein the energy bandgap of the first semiconductor nanocrystal is less than or equal to the energy bandgap of the third semiconductor nanocrystal.

3. The semiconductor nanocrystal particle of claim 1, wherein the core, the first shell, and the second shell comprise a Group II-VI compound.

4. The semiconductor nanocrystal particle of claim 1, wherein the first semiconductor nanocrystal comprises ZnS, ZnSeS, or a combination thereof.

5. The semiconductor nanocrystal particle of claim 1, wherein the first semiconductor nanocrystal does not comprise copper, manganese, or a combination thereof.

6. The semiconductor nanocrystal particle of claim 1, wherein the second semiconductor nanocrystal comprises ZnSe, ZnSeS, ZnSeTe, or a combination thereof.

7. The semiconductor nanocrystal particle of claim 1, wherein the first shell comprises a plurality of layers and in the plurality of layers, adjacent layers comprise semiconductor nanocrystals of different compositions from each other.

8. The semiconductor nanocrystal particle of claim 7, wherein the first shell comprises a first layer and a second layer and an energy bandgap of the semiconductor nanocrystal in the first layer is less than an energy bandgap of the semiconductor nanocrystal in the second layer.

9. The semiconductor nanocrystal particle of claim 1, wherein the third semiconductor nanocrystal comprises ZnS.

10. The semiconductor nanocrystal particle of claim 1, wherein a maximum photoluminescent peak of the semiconductor nanocrystal particle is present in a range between about 416 nanometers and about 470 nanometers.

11. The semiconductor nanocrystal particle of claim 1, wherein a maximum photoluminescent peak of the semiconductor nanocrystal particle has a full width at half maximum of less than or equal to about 40 nanometers.

12. The semiconductor nanocrystal particle of claim 1, wherein a maximum photoluminescent peak of the semiconductor nanocrystal particle has a full width at half maximum of less than or equal to about 30 nanometers.

13. The semiconductor nanocrystal particle of claim 1, wherein a quantum efficiency of the semiconductor nanocrystal particle is greater than or equal to about 80%.

14. A quantum dot population comprising a plurality of semiconductor nanocrystal particles, wherein the plurality of semiconductor nanocrystal particles comprises a semiconductor nanocrystal particle of claim 1 and wherein an average size of the plurality of semiconductor nanocrystal particles is greater than or equal to about 5 nanometers and less than or equal to about 50 nanometers.

15. The quantum dot population of claim 14, wherein a standard deviation of the sizes of the plurality of semiconductor nanocrystal particles is less than or equal to about 10%.

16. A method of producing the semiconductor nanocrystal particle of claim 1, the method comprising
providing a core particle comprising the core, the core comprising the first semiconductor nanocrystal;
conducting a reaction between a second metal precursor and a second non-metal precursor of the second semiconductor nanocrystal in the presence of the core particle, an organic solvent, and an organic ligand, to obtain a reaction solution comprising a particle comprising the first shell comprising the second semiconductor nanocrystal on the core particle;
adding a third metal precursor and a third non-metal precursor of the third semiconductor nanocrystal to the reaction solution to conduct a reaction therebetween to obtain the semiconductor nanocrystal particle comprising the second shell comprising the third semiconductor nanocrystal formed on the first shell.

17. The method of claim 16, wherein the forming of the first shell comprises heating a mixture of the organic solvent, the organic ligand, and the second metal precursor to a first reaction temperature, and adding the core particle and the second non-metal precursor to the mixture heated to the first reaction temperature.

18. A light emitting device comprising:
a first electrode and a second electrode facing each other, and
a quantum dot light emitting layer disposed between the first electrode and the second electrode, the quantum dot light emitting layer comprising a plurality of quantum dots, wherein the plurality of quantum dots comprises a semiconductor nanocrystal particle of claim 1.

19. The light emitting device of claim 18, wherein the device further comprises a charge auxiliary layer between the first electrode and the quantum dot light emitting layer, between the second electrode and the quantum dot light emitting layer, or between the first electrode and the quantum dot light emitting layer and between the second electrode and the quantum dot light emitting layer.

20. The light emitting device of claim 19, wherein the charge auxiliary layer comprises a charge transporting layer, a charge injection layer, or the charge transporting layer and the charge injection layer.

21. A semiconductor nanocrystal particle comprising:
a core comprising a first semiconductor nanocrystal,
a first shell surrounding the core, the first shell comprising a second semiconductor nanocrystal that has a different composition from the first semiconductor nanocrystal, and
a second shell surrounding the first shell, the second shell comprising a third semiconductor nanocrystal that has a different composition from the second semiconductor nanocrystal,
wherein the first semiconductor nanocrystal comprises zinc and sulfur;
wherein the third semiconductor nanocrystal comprises zinc and sulfur;
wherein an energy bandgap of the second semiconductor nanocrystal is less than an energy bandgap of the first semiconductor nanocrystal, and the energy bandgap of the second semiconductor nanocrystal is less than an energy bandgap of the third semiconductor nanocrystal;
wherein the semiconductor nanocrystal particle does not comprise cadmium;
wherein the first shell comprises a plurality of layers and in the plurality of layers, adjacent layers comprise semiconductor nanocrystals of different compositions from each other;
wherein the first shell comprises a first layer and a second layer and an energy bandgap of the semiconductor nanocrystal in the first layer is less than an energy bandgap of the semiconductor nanocrystal in the second layer; and
wherein the first layer comprises ZnSeTe and the second layer comprises ZnSe.

22. A semiconductor nanocrystal particle comprising:
a core comprising a first semiconductor nanocrystal,
- a first shell surrounding the core, the first shell comprising a second semiconductor nanocrystal that has a different composition from the first semiconductor nanocrystal, and
- a second shell surrounding the first shell, the second shell comprising a third semiconductor nanocrystal that has a different composition from the second semiconductor nanocrystal, wherein the first semiconductor nanocrystal comprises zinc and sulfur;

wherein the third semiconductor nanocrystal comprises zinc and sulfur;

wherein an energy bandgap of the second semiconductor nanocrystal is less than an energy bandgap of the first semiconductor nanocrystal, and the energy bandgap of the second semiconductor nanocrystal is less than an energy bandgap of the third semiconductor nanocrystal;

wherein the semiconductor nanocrystal particle does not comprise cadmium;

wherein the first shell comprises zinc, tellurium, and selenium, and wherein a quantum efficiency of the semiconductor nanocrystal particle is greater than or equal to about 60%.

* * * * *